United States Patent
Schweinbenz et al.

(10) Patent No.: US 7,729,117 B2
(45) Date of Patent: Jun. 1, 2010

(54) HOUSING FOR COOLING ELECTRONIC CONTROL UNITS IN MOTOR VEHICLES

(75) Inventors: Jochen Schweinbenz, Stuttgart (DE); Peter Schiefer, Unterheinriet (DE); Dirk Schmidt, Leinfelden-Echterdingen (DE); Gero Haehnel, Filderstadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/821,737

(22) Filed: Apr. 9, 2004

(65) Prior Publication Data

US 2004/0257757 A1 Dec. 23, 2004

(30) Foreign Application Priority Data

Apr. 17, 2003 (DE) .................. 103 17 705

(51) Int. Cl.
*H05K 7/20* (2006.01)
*F28D 15/00* (2006.01)
*H01L 23/34* (2006.01)

(52) U.S. Cl. .................. 361/699; 361/702; 361/715; 165/104.33; 165/80.4; 165/80.5; 165/104.19; 257/714; 257/E23.098

(58) Field of Classification Search .................. 361/699; 165/80.4, 104.33
See application file for complete search history.

(56) References Cited

U.S. PATENT DOCUMENTS

| | | | | | |
|---|---|---|---|---|---|
| 4,652,970 | A | * | 3/1987 | Watari et al. | 361/699 |
| 5,159,529 | A | * | 10/1992 | Lovgren et al. | 361/699 |
| 5,442,023 | A | * | 8/1995 | Argyropoulos et al. | 526/320 |
| 6,166,907 | A | * | 12/2000 | Chien | 361/699 |
| 6,302,190 | B1 | * | 10/2001 | Clamp et al. | 165/80.4 |
| 6,434,003 | B1 | * | 8/2002 | Roy et al. | 361/699 |
| 6,442,023 | B2 | * | 8/2002 | Cettour-Rose et al. | 361/690 |
| 6,536,516 | B2 | * | 3/2003 | Davies et al. | 165/170 |
| 2002/0166519 | A1 | | 11/2002 | Skrzypchak et al. | |

FOREIGN PATENT DOCUMENTS

| | | | |
|---|---|---|---|
| DE | 2823666 | * | 6/1979 |
| EP | 0 309 986 | | 4/1989 |
| EP | 0 968 885 | | 1/2000 |
| GB | 2 352 092 | | 1/2001 |

* cited by examiner

*Primary Examiner*—Zachary M Pape
(74) *Attorney, Agent, or Firm*—Kenyon & Kenyon LLP

(57) ABSTRACT

A housing for electronic control units, in particular in motor vehicles, having a bottom section for attaching the electronic control units and having a cooling device that enables heat to be dissipated from the housing via a flowing liquid, a cooling device formed in the bottom section being provided both for improving the cooling capacity and for rigidity. The bottom section is easily manufactured with an integrated cooling channel by injection molding, while cooling is achievable by a medium available in the motor vehicle.

9 Claims, 2 Drawing Sheets

HOUSING FOR COOLING ELECTRONIC CONTROL UNITS IN MOTOR VEHICLES

FIELD OF THE INVENTION

The present invention relates to a housing for electronic control units, in particular in motor vehicles, having a bottom section for attaching the electronic control units and having a cooling device that enables heat to be dissipated from the housing via a liquid flowing through.

BACKGROUND INFORMATION

Electronic control units must be cooled in order for them to operate correctly. This is especially true of those electronic control units that are operated in areas subjected to high temperature, such as the engine compartment of a motor vehicle. Due to these special temperature conditions, electronic control units have customarily been mounted at points in the vehicle that are subjected to less heat or on separate heat sinks.

A housing of the type mentioned above is described in European Patent Application No. EP 0 968 885. In this previously known housing, the bottom section is provided with a recess for inserting an electronic control unit, the cooling device having cooling channels that are shaped to be open in the vicinity of three side edges of the recess and are closed by a separate cover. Additional method steps, such as welding on a cover or screwing on a cover to form a seal, are necessary to produce these cooling channels. One disadvantage of this previously known housing is that it provides inadequate cooling efficiency because heat is mainly dissipated only at three side edges of the recess for the electronic control unit.

SUMMARY OF THE INVENTION

Consequently, an object of the present invention is to provide a housing which combines the advantages of low-cost manufacturing with a high cooling capacity.

Based on the design according to the present invention, a housing having an integrated cooling device is advantageously provided which enables electrical control units to be operated in areas subjected to high temperatures, for example in the engine compartment of a motor vehicle. Integrating the cooling device into the bottom section establishes ideal conditions for transferring heat between the electronic control unit and the cooling device, making it possible to achieve especially effective cooling.

At the same time, the object of the present invention advantageously establishes the conditions for simplifying the cooling channel geometry so that the bottom section may be manufactured in a single step, for example by lost-wax casting.

The production costs may be advantageously lowered by reducing and standardizing the necessary manufacturing steps, and the housings for electronic control units may be designed flexibly and in a manner that improves performance due to greater heat dissipation.

DETAILED DESCRIPTION

Figure 1:
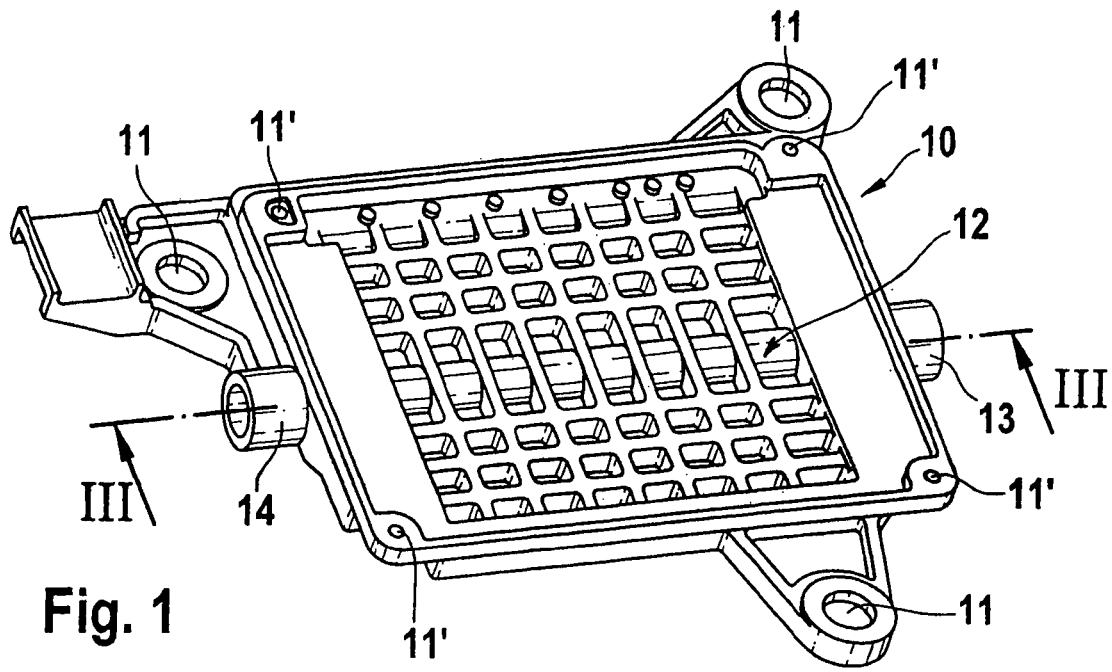
FIG. 1 shows a perspective top view of a bottom section of a housing for electronic control units, according to an exemplary embodiment of the present invention.
Figure 2:
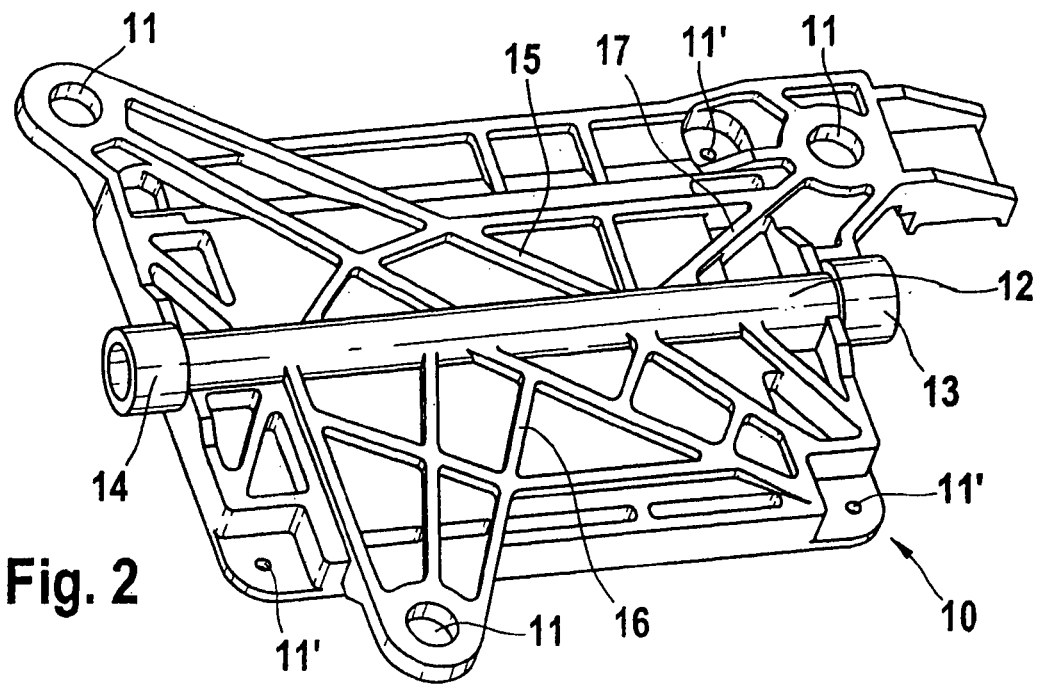
FIG. 2 shows a perspective view of the bottom section illustrated in FIG. 1, seen from below.
Figure 3:
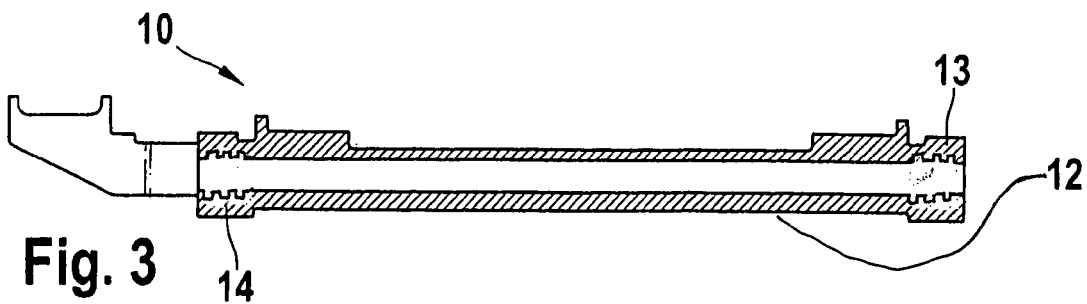
FIG. 3 shows a sectional view along line of intersection III-III in FIG. 1.
Figure 4:
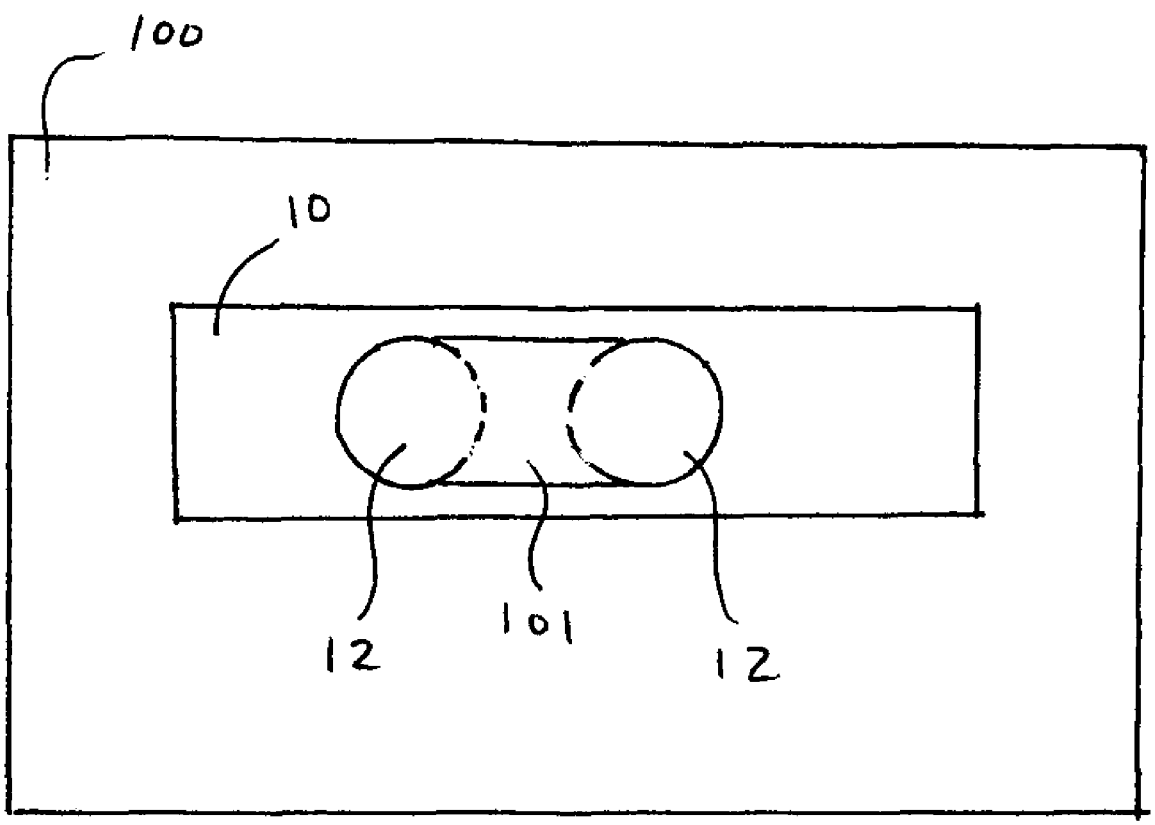
FIG. 4 shows a schematic illustration of a bottom section including two cooling channels connected by a cross hole.

FIGS. 1 through 3 show only an approximately rectangular bottom section 10 of the housing for electronic control units, in particular in motor vehicles (an example of which is illustrated schematically and designated by reference numeral 100 in FIG. 4), having three fastening points 11 on the vehicle side and four through-holes 11' that are located in the four corners for screw attachment to a cover that is not illustrated, as well as a p.c. board that is also not illustrated. In its center, bottom section 10 accommodates, as the cooling device, a cooling channel 12 that has a linear design and is manufactured in a single piece with bottom section 10. At opposite ends of bottom section 10, cooling channel 12 empties into threaded connectors 13 and 14, respectively, to which hoses or pipes may be connected for supplying and discharging the cooling liquid, in particular water or fuel, to and from the cooling device.

As is clearly illustrated in the perspective bottom view shown in FIG. 2, sectional members 15, 16, 17, etc., which help conduct heat and reinforce bottom section 10, are provided on the outside of cooling channel 12. Bottom section 10 is thus designed as a cooling plate.

The bottom section is manufactured by injection molding, preferably die-casting, the geometry of cooling channel 12 being produced during casting by two sliding members that meet in the middle. This advantageously seals cooling channel 12 as early as in the first step of the production process.

Cooling channel 12 preferably has a round cross-section. Alternatively, the cross-section may be provided with an oval, approximately square or rectangular or any other easily manufacturable shape that has a large surface area to facilitate heat transferability and mechanical rigidity.

Alternatively, multiple separate cooling channels 12, as shown schematically in FIG. 4, that are either connected separately or via an additional cross hole 101 (as shown schematically in FIG. 4) may be provided in the bottom section or cooling plate instead of a single cooling channel 12. Cooling channel 12 or multiple cooling channels simultaneously reinforce bottom section 10 and thus also the housing, thereby improving vibration properties.

To help achieve a good and effective cooling performance, the cross-section of cooling channel 12 may also be dimensioned for high liquid throughput and thus efficient heat dissipation.

What is claimed is:

1. A housing for electronic control units, wherein the housing is situated in a motor vehicle, the housing comprising: a bottom section configured to be affixed to a circuit board; and a cooling device for enabling heat to be dissipated from the housing via a liquid flowing therethrough, wherein the cooling device is integrally formed in the bottom section, and wherein the bottom section is formed as a cooling plate, and wherein the cooling device includes at least one one-piece cooling tube integrally formed in the bottom section and extending substantially across the length of the bottom section, wherein an interior channel of the one-piece cooling tube is enclosed relative to the bottom section, wherein the entire bottom section including the one-piece cooling tube is formed of a single structural component without joining seams, and wherein sectional members are provided on the outside of the one-piece cooling tube, the sectional members extending diagonally from the one-piece cooling tube to at least one fastening point.

2. The housing according to claim 1, wherein sectional members for conducting heat and reinforcing the bottom section are connected to the outside of the cooling tube.

3. The housing according to claim 1, wherein the one-piece cooling tube is a linear cooling tube which passes through the bottom section in a linear manner.

4. The housing according to claim 1, wherein the one-piece cooling tube has a round cross-section.

5. The housing according to claim 1, wherein an inlet of the one-piece cooling tube and an outlet of the one-piece cooling tube have threaded connectors leading into and out of the bottom section.

6. The housing according to claim 1, wherein the cooling device includes a plurality of one-piece cooling tubes integrally formed in the bottom section.

7. The housing according to claim 6, wherein the one-piece cooling tubes are connected by at least one separate cross hole.

8. The housing according to claim 1, wherein the bottom section is manufactured by injection molding.

9. The housing according to claim 1, wherein the bottom section is manufactured by die-casting.

* * * * *